(12) United States Patent
Tanaka et al.

(10) Patent No.: US 7,911,317 B2
(45) Date of Patent: Mar. 22, 2011

(54) MULTILAYER CHIP VARISTOR AND ELECTRONIC COMPONENT

(75) Inventors: Ryuichi Tanaka, Tokyo (JP); Goro Takeuchi, Tokyo (JP); Hiroyuki Sato, Tokyo (JP); Osamu Taguchi, Tokyo (JP)

(73) Assignee: TDK Corporation, Tokyo (JP)

( * ) Notice: Subject to any disclaimer, the term of this patent is extended or adjusted under 35 U.S.C. 154(b) by 54 days.

(21) Appl. No.: 12/536,944

(22) Filed: Aug. 6, 2009

(65) Prior Publication Data
US 2010/0066479 A1  Mar. 18, 2010

(30) Foreign Application Priority Data
Sep. 16, 2008  (JP) ................................. 2008-237036

(51) Int. Cl.
*H01C 7/10* (2006.01)
(52) U.S. Cl. .......................................... 338/20; 338/21
(58) Field of Classification Search .................... 338/20, 338/21
See application file for complete search history.

(56) References Cited

U.S. PATENT DOCUMENTS

| | | | | |
|---|---|---|---|---|
| 5,155,464 A * | 10/1992 | Cowman et al. | ................. | 338/21 |
| 6,184,769 B1 * | 2/2001 | Nakamura et al. | .............. | 338/21 |
| 6,385,034 B2 * | 5/2002 | Tanaka | ........................ | 361/306.3 |
| 6,873,513 B2 * | 3/2005 | Anthony | ........................ | 361/118 |

FOREIGN PATENT DOCUMENTS
JP  A-2002-246207  5/2002
* cited by examiner

*Primary Examiner* — Kyung Lee
(74) *Attorney, Agent, or Firm* — Oliff & Berridge, PLC

(57) ABSTRACT

A multilayer chip varistor is provided as one having excellent heat radiation performance. A thickness between a first principal face 3 and an outermost internal electrode layer 11A is smaller than a thickness between an internal electrode layer 21 and the outermost internal electrode layer 11A, and because of this configuration, heat generated from a bottom face of a semiconductor light emitting device LE1 is efficiently transferred to the outermost internal electrode layer 11A having a high thermal conductivity. Furthermore, in the multilayer chip varistor V1 of an electronic component EC1, the outermost internal electrode layer 11A has a first internal electrode 13 electrically connected to a first connection electrode 7 and a first terminal electrode 5 through first through-hole conductors 17, and a second internal electrode 15 electrically connected to a second connection electrode 8 and a second terminal electrode 6 through second through-hole conductors 27. Because of this configuration, heat H generated from the semiconductor light emitting device LE1 is transferred to both the first internal electrode 13 and the second internal electrode 15, so as to be transferred to the first through-hole conductors 17 and the second through-hole conductors 27. This leads to well-balanced transfer of heat to the first through-hole conductors 17 and the second through-hole conductors 27.

7 Claims, 14 Drawing Sheets

MULTILAYER CHIP VARISTOR AND ELECTRONIC COMPONENT

BACKGROUND OF THE INVENTION

1. Field of the Invention

The present invention relates to a multilayer chip varistor and an electronic component.

2. Related Background Art

There is a known multilayer chip varistor having a varistor element body in which a plurality of varistor layers are laminated together, a pair of internal electrodes of a flat plate shape arranged as opposed to each other with a varistor layer in between inside the varistor element body, and a pair of external terminal electrodes electrically connected to the associated internal electrodes (e.g., cf. Japanese Patent Application Laid-open No. 2002-246207).

SUMMARY OF THE INVENTION

The multilayer chip varistor is connected in parallel to an electronic device such as a semiconductor light emitting device or FET (Field Effect Transistor) and protects the electronic device from ESD (Electrostatic Discharge) surges. However, many electronic devices generate heat during operation. Therefore, as an electronic device becomes hot, characteristics of the device itself become deteriorated to affect the operation thereof. In light of the above, the aforementioned multilayer chip varistor to be connected to the electronic device is required to have good heat radiation performance.

The present invention has been accomplished in order to solve the above problem and an object of the present invention is to provide a multilayer chip varistor having excellent heat radiation performance.

A multilayer chip varistor according to the present invention is a multilayer chip varistor comprising: a varistor element body exhibiting a nonlinear voltage-current characteristic and having a first principal face and a second principal face opposed to each other; a plurality of internal electrode layers arranged with a part of the varistor element body in between, in the varistor element body; a first connection electrode arranged on the first principal face and a second connection electrode arranged on the first principal face; and a first terminal electrode arranged on the second principal face and electrically connected to the first connection electrode, and a second terminal electrode arranged on the second principal face and electrically connected to the second connection electrode, wherein an outermost internal electrode layer arranged nearest to the first principal face among the plurality of internal electrode layers has a first internal electrode electrically connected to the first connection electrode and the first terminal electrode through a first internal conductor, and a second internal electrode electrically connected to the second connection electrode and the second terminal electrode through a second internal conductor, and wherein a thickness between the first principal face and the outermost internal electrode layer is smaller than a thickness between the outermost internal electrode layer and the other internal electrode layer opposed to the outermost internal electrode layer on the second principal face side.

An electronic component according to the present invention is an electronic component comprising: a multilayer chip varistor comprising: a varistor element body exhibiting a nonlinear voltage-current characteristic and having a first principal face and a second principal face opposed to each other; a plurality of internal electrode layers arranged with a part of the varistor element body in between, in the varistor element body; a first connection electrode arranged on the first principal face and a second connection electrode arranged on the first principal face; and a first terminal electrode arranged on the second principal face and electrically connected to the first connection electrode, and a second terminal electrode arranged on the second principal face and electrically connected to the second connection electrode; and an electronic device electrically connected to the first and second connection electrodes of the multilayer chip varistor, wherein an outermost internal electrode layer arranged nearest to the first principal face among the plurality of internal electrode layers has a first internal electrode electrically connected to the first connection electrode and the first terminal electrode through a first internal conductor, and a second internal electrode electrically connected to the second connection electrode and the second terminal electrode through a second internal conductor, and wherein a thickness between the first principal face and the outermost internal electrode layer is smaller than a thickness between the outermost internal electrode layer and the other internal electrode layer opposed to the outermost internal electrode layer on the second principal face side.

In the multilayer chip varistor and the electronic component according to the present invention, the thickness between the first principal face and the outermost internal electrode layer is smaller than the thickness between the outermost internal electrode layer and the other internal electrode layer opposed thereto on the second principal face side. Therefore, heat generated from the electronic device mounted on the first and second connection electrodes is efficiently transferred to the outermost internal electrode layer having a high thermal conductivity. Furthermore, the outermost internal electrode layer has the first internal electrode electrically connected to the first connection electrode and the first terminal electrode through the first internal conductor, and the second internal electrode electrically connected to the second connection electrode and the second terminal electrode through the second internal conductor. Therefore, the heat generated from the electronic device is transferred to both the first internal electrode and the second internal electrode, so as to be transferred to both of the first internal conductor and the second internal conductor. This enables well-balanced transfer of heat to the first internal conductor and to the second internal conductor and thus improves heat radiation efficiency, thereby achieving excellent heat radiation performance.

The multilayer chip varistor according to the present invention is preferably so configured that the varistor element body comprises a planar member which has a thermal conductivity higher than that of the varistor element body and which is not electrically connected to the first and second connection electrodes, and that the planar member is arranged on the first principal face side with respect to the outermost internal electrode layer For this reason, the heat from the electronic device diffuses in the planar member with the high thermal conductivity to be uniformly transferred to the outermost internal electrode layer.

The multilayer chip varistor according to the present invention is preferably so configured that the first internal electrode has a plurality of first electrode portions in a predetermined direction intersecting with a direction in which the first principal face and the second principal face are opposed, that the second internal electrode has a plurality of second electrode portions in the predetermined direction, and that the plurality of first electrode portions and the plurality of second electrode portions are arranged in an alternating manner in the predetermined direction. When the first internal electrode and the second internal electrode have their respective electrode portions in the predetermined direction as in the above-described configuration, the internal electrodes become elongated in the direction perpendicular to the predetermined direction. Therefore, heat is securely transferred in desired directions, i.e., in directions toward locations where the internal conductors are arranged.

The multilayer chip varistor according to the present invention is preferably so configured that the first and second internal conductors are through-hole conductors penetrating an interior of the varistor element body in the direction in which the first principal face and the second principal face are opposed. When the through-hole conductors are used as the internal conductors, the heat from the electronic device is transferred in the penetration direction through the through-hole conductors to be efficiently dissipated.

The electronic component according to the present invention is preferably so configured that the first and second internal electrodes have respective regions overlapping with the electronic device when viewed from the direction in which the first principal face and the second principal face are opposed. This configuration permits the heat generated from the electronic device to be securely transferred through the first internal electrode and the second internal electrode to the first internal conductor and the second internal conductor.

In the electronic component according to the present invention, the electronic device is, for example, a semiconductor light emitting device.

DESCRIPTION OF THE PREFERRED EMBODIMENTS

The preferred embodiments of the present invention will be described below in detail with reference to the accompanying drawings. In the description, the same elements or elements with the same functionality will be denoted by the same reference symbols, without redundant description.

First Embodiment

Figure 1:
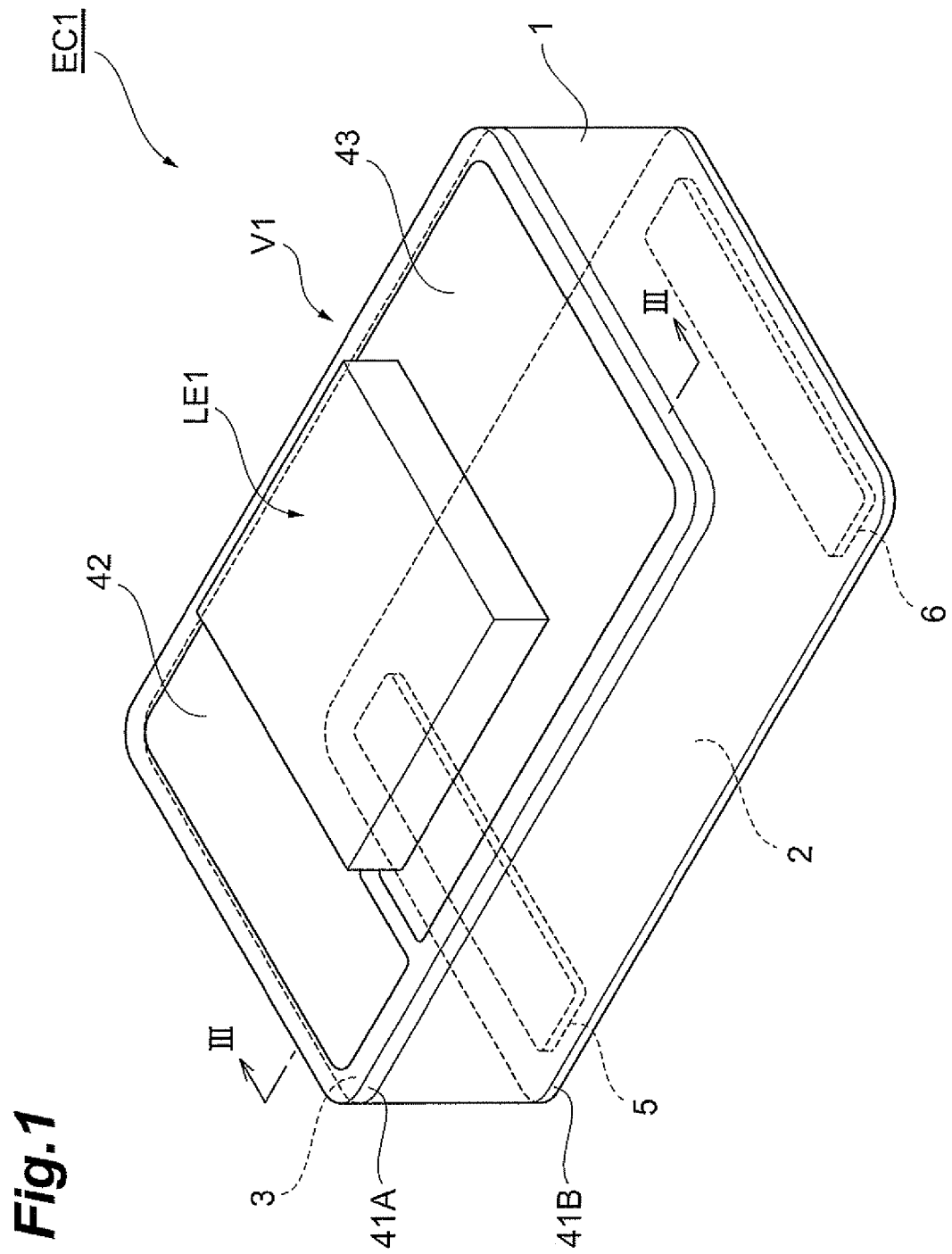
FIG. 1 is a perspective view showing an electronic component and a multilayer chip varistor according to the first embodiment of the present invention.
Figure 2:
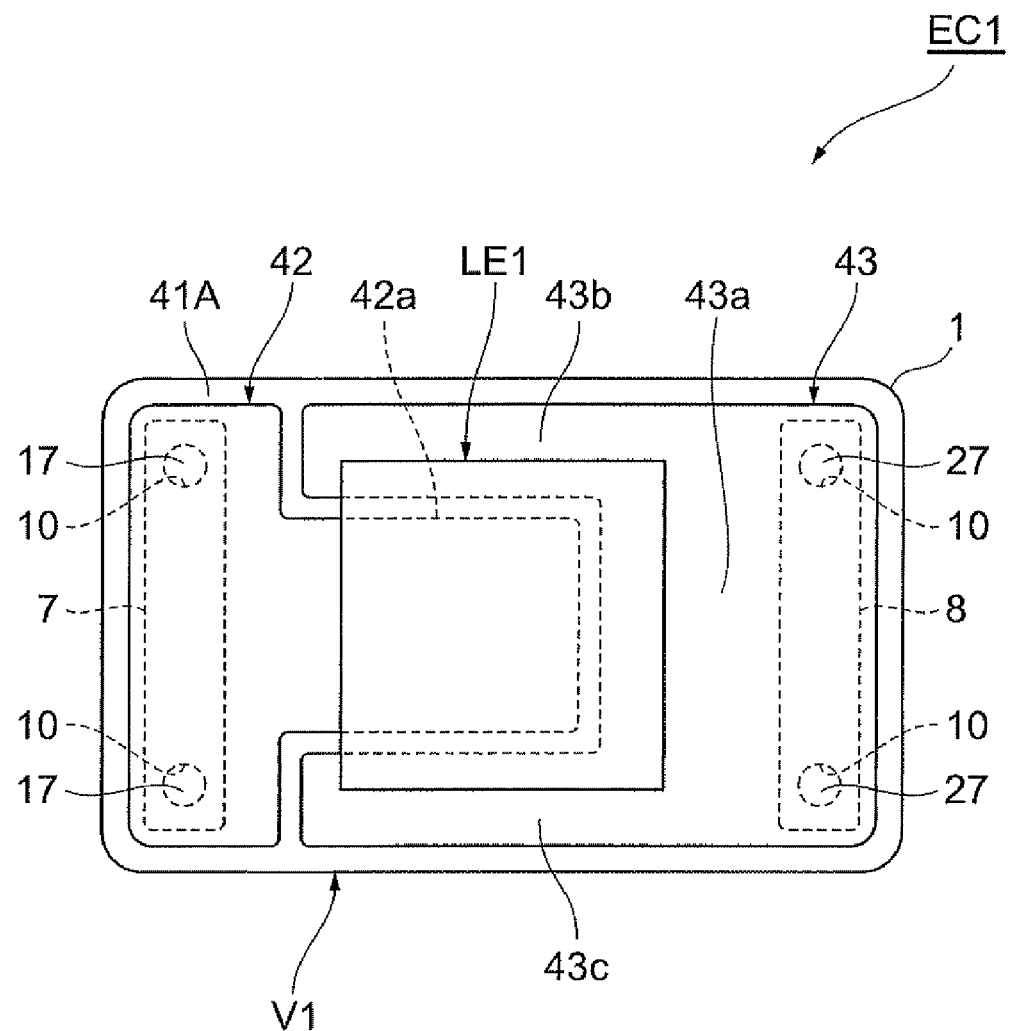
FIG. 2 is a top plan view showing the electronic component and the multilayer chip varistor according to the first embodiment of the present invention.
Figure 3:
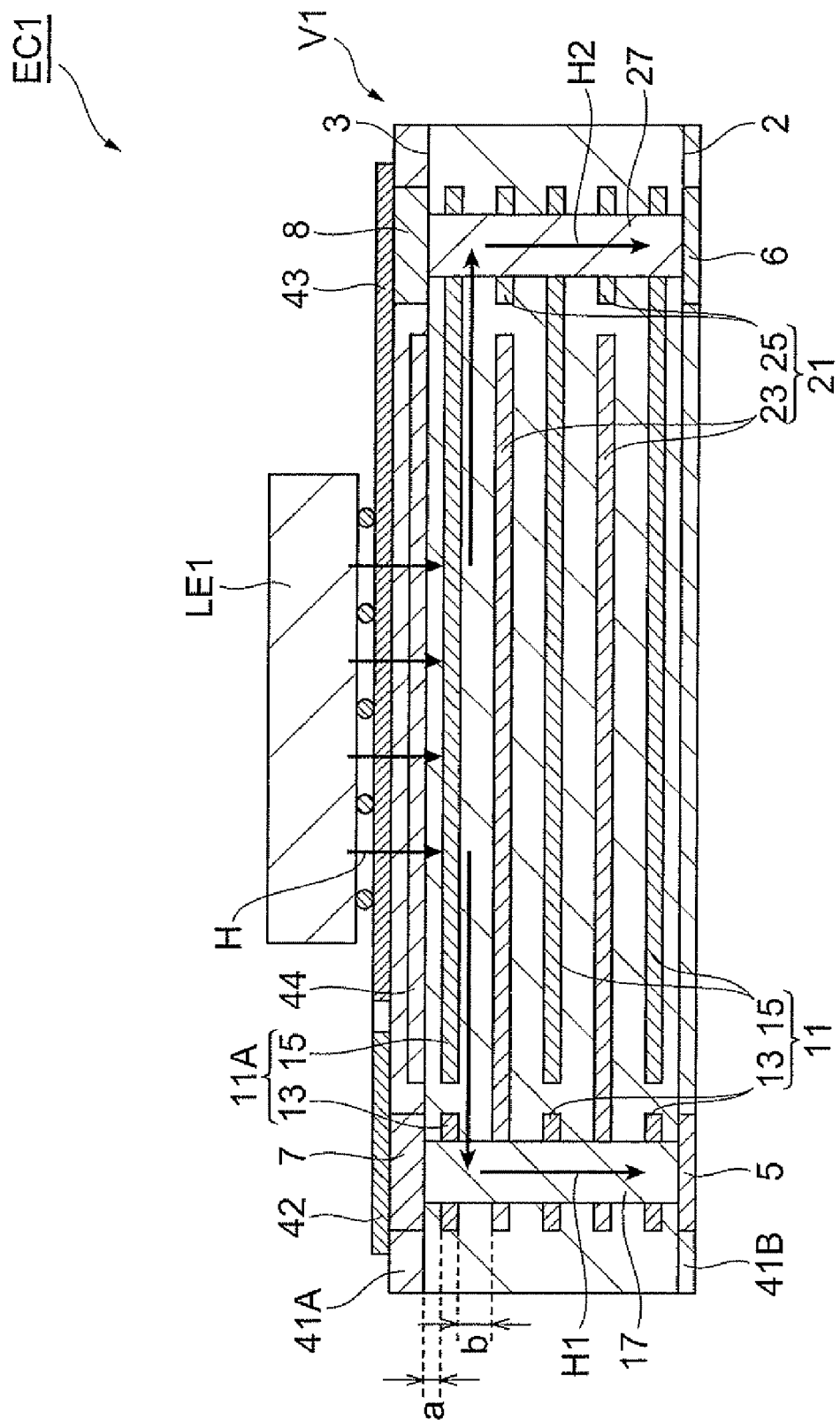
FIG. 3 is a sectional view along line III-III shown in FIG. 1, of the electronic component and the multilayer chip varistor according to the first embodiment of the present invention
Figure 4:
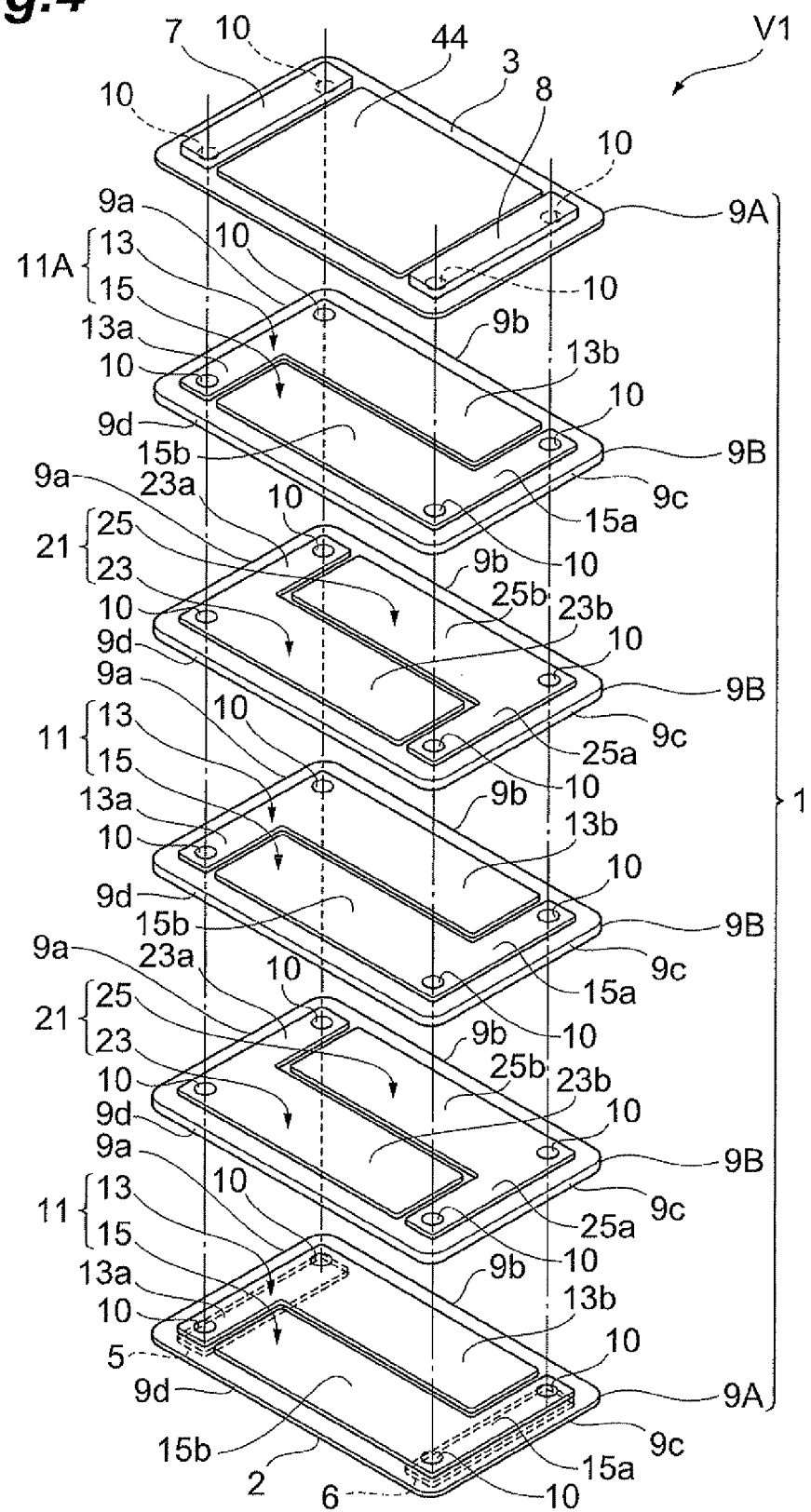
FIG. 4 is a development view in which a varistor element body is developed for illustrating each of varistor layers.

Configurations of an electronic component EC1 and a multilayer chip varistor V1 according to the first embodiment of the present invention will be described with reference to FIGS. 1 to 4. FIG. 1 is a perspective view showing the electronic component EC1 and multilayer chip varistor V1 according to the first embodiment of the present invention. FIG. 2 is a top plan view showing the electronic component EC1 and multilayer chip varistor V1 according to the first embodiment of the present invention. FIG. 3 is a sectional view along line III-III shown in FIG. 1, of the electronic component and multilayer chip varistor V1 according to the first embodiment of the present invention. FIG. 4 is a development view in which a varistor element body 1 is developed for illustrating each of varistor layers. It is noted that FIG. 4 is depicted without illustration of through-hole conductors 17, 27 and with illustration of through holes 10 formed in varistor layers 9A, 9B.

As shown in FIGS. 1 and 2, the electronic component EC1 is constructed in a structure in which the multilayer chip varistor V1 is connected in parallel to a semiconductor light emitting device (electronic device) LE1. A first external electrode 42 and a second external electrode 43 are formed on an insulating layer 41A formed on a first principal face 3 of the multilayer chip varistor V1. The semiconductor light emitting device LE1 is mounted on the first external electrode 42 and the second external electrode 43 by bonding. The semiconductor light emitting device LE1 used herein is, for example, a Light Emitting Diode (LED) of a GaN (gallium nitride) semiconductor. This semiconductor light emitting device LE1 is of a square plate-like shape.

The multilayer chip varistor V1 is an element having a function to protect the semiconductor light emitting device LE1 from ESD (Electrostatic Discharge) surges. The multilayer chip varistor V1 has a varistor element body 1 constructed in a nearly rectangular parallelepiped shape such that a plurality of varistor layers of a rectangular plate shape are laminated together to be integrated, a first terminal electrode 5 and a second terminal electrode 6, and the first external electrode 42 and second external electrode 43.

The first terminal electrode 5 and second terminal electrode 6 are formed each on a second principal face 2 of the varistor element body 1. The first external electrode 42 and second external electrode 43 are formed each on the insulating layer 41A on the first principal face 3. The dimensions of the varistor element body 1 are set, for example, to be 1.0-2.0 mm long, 0.8-1.5 mm wide, and 0.2-0.8 mm thick. The first terminal electrode 5 functions as an input terminal electrode of the multilayer chip varistor V1 and the second terminal electrode 6 functions as an output terminal electrode of the multilayer chip varistor V1. The first external electrode 42 and second external electrode 43 function as pad electrodes electrically connected to the semiconductor light emitting device LE1.

The first terminal electrode 5 and second terminal electrode 6 are arranged with a predetermined space between them and on both longitudinal end sides of the second principal face 2, on the second principal face 2 of the rectangular shape of the varistor element body 1. The terminal electrodes 5, 6 are of a rectangular shape extending along the width direction of the second principal face 2. The dimensions of the terminal electrodes 5, 6 are set, for example, as follows: a length of each long side about 1.0 mm; a length of each short side about 0.4 mm; a thickness about 5 μm.

The first external electrode 42 has an electrode portion 42a of a rectangular shape extending from one end side toward the other end side in the longitudinal direction of the insulating layer 41A, on the insulating layer 41A covering the first principal face 3 of the varistor element body 1. This electrode portion 42a is arranged in the center in the width direction of the insulating layer 41A and extends from the one end side in the longitudinal direction over the center position in the longitudinal direction to a position on the other end side. The second external electrode 43 is formed in such an approximate U-shape as to surround the electrode portion 42a of the first external electrode 42, on the insulating layer 41A. Namely, the second external electrode 43 is composed of an electrode portion 43a of a rectangular shape extending in the width direction of the insulating layer 41A, on the other end side in the longitudinal direction of the insulating layer 41A, and electrode portions 43b, 43c extending on both sides of the electrode portion 42a of the first external electrode 42, from both end sides in the width direction of the electrode portion 43a toward the one end side in the longitudinal direction.

The terminal electrodes 5, 6 are formed by transferring an electrode paste containing Ag or the like as a major component, onto the exterior surface of the varistor element body 1, thereafter firing it at a predetermined temperature (e.g., approximately 700° C.), and electroplating it. The electroplating can be carried out using Ni/Au or the like. The external electrodes 42, 43 are formed by printing an electroconductive paste consisting of a mixture of an organic binder and an organic solvent with a metal powder containing Au particles or Ag particles as a major component, drying it, and simultaneously firing it at a predetermined temperature (e.g., a temperature of not less than 800° C.) in an $O_2$ atmosphere.

The varistor element body 1, as shown in FIG. 4, is constructed as a laminate in which a plurality of varistor layers 9A, 9B of a rectangular plate shape to exhibit a nonlinear voltage-current characteristic (which will be referred to hereinafter as "varistor characteristic"), and a plurality of internal electrode layers 11 and internal electrode layers 21 are laminated together. The internal electrode layers 11 and the internal electrode layers 21 are arranged as respective independent layers along a lamination direction of the varistor layers 9A, 9B (which will be referred to hereinafter simply as "lamination direction") in the varistor element body 1. The internal electrode layers 11 and the internal electrode layers 21 are arranged as opposed to each other with at least one varistor layer 9B in between. As shown in FIGS. 3 and 4, the first principal face 3 and the second principal face 2 of the varistor element body 1 are opposed to each other and are perpendicular to the lamination direction of varistor layers 9A, 9B, i.e., perpendicular to a direction in which the internal electrode layers 11 and internal electrode layers 21 are opposed. In the practical multilayer chip varistor V1, the plurality of varistor layers 9A, 9B are so integrated that no boundary can be visually recognized between them.

On the varistor layer 9A forming the first principal face 3 (i.e., the varistor layer arranged at the uppermost location in FIG. 4) among the varistor layers forming the varistor element body 1, there are provided a first connection electrode 7 electrically connected to the first external electrode 42, a second connection electrode 8 electrically connected to the second external electrode 43, and a dummy plate (planar member) 44 arranged in the center of the varistor layer 9A. An internal electrode layer 11 is formed on the varistor layer 9B adjacent to the varistor layer 9A forming the first principal face 3 (i.e., on the second varistor layer from the top in FIG. 4). An internal electrode layer 21 is formed on the next varistor layer 9B. An internal electrode layer 11 or internal electrode layer 21 is formed on each of the other varistor layers 9B. An internal electrode layer 11 is formed on the varistor layer 9A forming the second principal face 2 (i.e., on the varistor layer arranged at the lowest position in FIG. 4) and the first terminal electrode 5 and second terminal electrode 6 are formed on the back side (i.e., on the second principal face 2). In the first embodiment, the internal electrode layer arranged nearest to the first principal face 3 among the internal electrode layers, i.e., the internal electrode layer 11 formed on the second varistor layer from the top in FIG. 4 is defined as an outermost internal electrode layer 11A.

The thickness of the varistor layer 9A is, for example, in the range of 5 to 15 μm and the thickness of the varistor layer 9B, for example, in the range of 10 to 20 μm. The varistor layer 9A is thinner than the varistor layer 9B. This makes a thickness between the first principal face 3 and the outermost internal electrode layer 11A (which is indicated by thickness a in FIG. 3) smaller than a thickness between the outermost internal electrode layer 11A and the other internal electrode layer 21 opposed to the outermost internal electrode layer 11A on the second principal face 2 side (which is indicated by thickness b in FIG. 3).

The varistor layers 9A, 9B are made of a substance containing ZnO (zinc oxide) as a major component and contains as minor components, simple metals such as rare earth metals, Co, IIIb elements (B, Al, Ga, In), Si, Cr, Mo, alkali metals (K, Rb, Cs), and alkali earth metals (Mg, Ca, Sr, Ba), and/or oxides thereof. In the first embodiment the varistor layers 9A, 9B may contain Pr, Co, Cr, Ca, Si, K, Al, and so on as minor components. Co and Pr serve as materials to make the varistor layers exhibit the varistor characteristic. There are no particular restrictions on a content of ZnO in the varistor layers 9A, 9B, but the content of ZnO is preferably in the range of 69.0 to 99.8% by mass, where the total content of materials constituting the varistor layers 9A, 9B is 100% by mass.

The first connection electrode 7 and the second connection electrode 8 are arranged with a predetermined space between them and on both longitudinal end sides of the first principal face 3, on the first principal face 3 of the rectangular shape of the varistor element body 1. The first connection electrode 7 and second connection electrode 8 are of a rectangular shape extending along the width direction of the first principal face 3 and have the same shape as the first terminal electrode 5 and the second terminal electrode 6 so as to overlap therewith when viewed from the lamination direction. The dimensions of the connection electrodes 7, 8 are set, for example, as follows: a length of each long side about 1.0 mm; a length of each short side about 0.4 mm; a thickness about 5 μm.

The dummy plate 44 is a metal plate of a rectangular shape formed so as to cover an almost entire area of the first principal face 3 between the first connection electrode 7 and the second connection electrode 8, in the center on the first principal face 3 of the varistor element body 1. This dummy plate 44 has a thermal conductivity higher than that of the varistor element body 1 and is not physically and electrically connected to the first connection electrode 7 and second connection electrode 8. The dimensions of the dummy plate 44 are set, for example, as follows: a length of each long side 0.3-1.0 mm; a length of each short side 0.3-1.0 mm; a thickness about 5 μm.

The first connection electrode 7, second connection electrode 8, and dummy plate 44 are formed by transferring an electrode paste containing Ag or the like as a major component, onto the exterior surface of the varistor element body 1, firing it at a predetermined temperature (e.g., about 700° C.), and electroplating it. The electroplating can be carried out using Ni/Au or the like.

The first principal face 3 on which the first connection electrode 7, second connection electrode 8, and dummy plate 44 are formed, is covered by an insulating layer 41A, as shown in FIG. 3. The second principal face 2 is also covered by an insulating layer 41B. The insulating layers 41A, 41B are formed, for example, by covering the entire areas of the first principal face 3 and second principal face 2 by polyimide. The insulating layer 41A completely covers the top surface of the dummy plate 44. The thickness of the insulating layer 41A is determined so as to expose the top surfaces of the first connection electrode 7 and second connection electrode 8. The thickness of the insulating layer 41B is determined so as to expose the top surfaces of the first terminal electrode 5 and second terminal electrode 6. An electroconductive paste is printed on the top surface of the insulating layer 41A so as to cover the exposed top surfaces of the first connection electrode 7 and second connection electrode 8, whereby the first connection electrode 7 and the first external electrode 42 are electrically connected and whereby the second connection electrode 8 and the second external electrode 43 are electrically connected.

Figure 5:
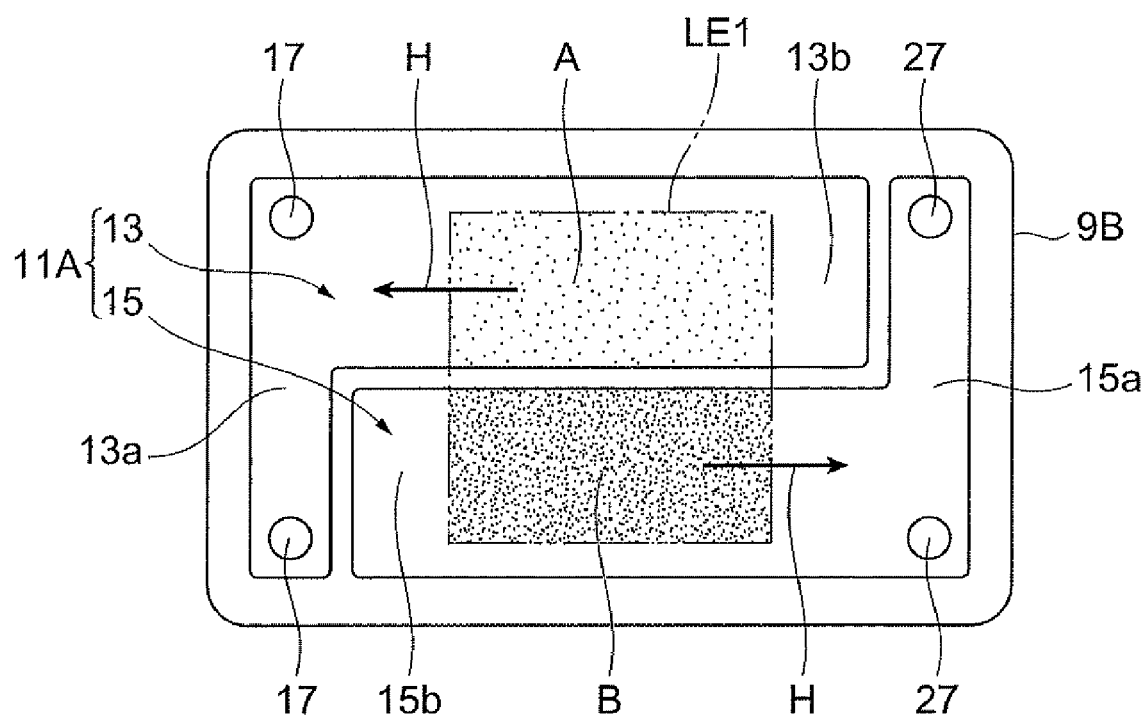
FIG. 5 is a drawing of an outermost internal electrode layer viewed from a lamination direction.

The outermost internal electrode layer 11A, as shown in FIGS. 4 and 5, is constructed with a first internal electrode 13 electrically connected through first through-hole conductors (first internal conductors) 17 to the first external electrode 42, first connection electrode 7, and first terminal electrode 5, and a second internal electrode 15 electrically connected through second through-hole conductors (second internal conductors) 27 to the second external electrode 43, second connection electrode 8, and second terminal electrode 6. The first internal electrode 13 and the second internal electrode 15 have mutually different polarities and are in no physical and electrical contact with each other. The first internal electrode 13 and second internal electrode 15 are formed by dividing an electrode of a rectangular plate shape covering an almost entire area of the top surface of the varistor layer 9B, in such an approximate L-shape that divided electrodes are in point symmetry with respect to a center point of the varistor layer 9B.

Specifically, the first internal electrode 13 includes an electrode portion 13a of a rectangular shape extending along one short edge 9a in the longitudinal direction of the varistor layer 9B, and an electrode portion 13b of a rectangular shape extending along one long edge 9b of the varistor layer 9B. The electrode portion 13a and electrode portion 13b are connected near the corner between the short edge 9a and the long edge 9b of the varistor layer 9B to be integrally formed. The second internal electrode 15 includes an electrode portion 15a of a rectangular shape extending along the other short edge 9c in the longitudinal direction of the varistor layer 9B, and an electrode portion 15b of a rectangular shape extending along the other long edge 9d of the varistor layer 9B. The electrode portion 15a and electrode portion 15b are connected near the corner between the short edge 9c and the long edge 9d of the varistor layer 913 to be integrally formed.

The electrode portion 13a of the first internal electrode 13 is formed in the same shape as the first connection electrode 7 and first terminal electrode 5 so as to overlap therewith when viewed from the lamination direction. The electrode portion 15a of the second internal electrode 15 is formed in the same shape as the second connection electrode 8 and second terminal electrode 6 so as to overlap therewith when viewed from the lamination direction. The electrode portion 13b of the first internal electrode 13 extends from the electrode portion 13a toward the electrode portion 15a while having a width nearly equal to half of the width of the varistor layer 9B. The electrode portion 15b of the second internal electrode 15 extends from the electrode portion 15a toward the electrode portion 13a while having a width nearly equal to half of the width of the varistor layer 9B. A space of a predetermined width is formed between the electrode portion 13a and the electrode portion 15b, between the electrode portion 13b and the electrode portion 15b, and between the electrode portion 13b and the electrode portion 15a so as to keep them in no contact with each other.

In the first internal electrode 13 and the second internal electrode 15 configured as described above, when viewed from the lamination direction, an area of an overlap region between the semiconductor light emitting device LE1 and the first internal electrode 13 is equal to an area of an overlap region between the semiconductor light emitting device LE1 and the second internal electrode 15. FIG. 5 is a drawing of the outermost internal electrode layer 11A viewed from the lamination direction. In FIG. 5, the semiconductor light emitting device LE1 is indicated by a chain double-dashed line, a light pear-skin pattern is provided for the overlap region A between the semiconductor light emitting device LE1 and the electrode portion 13b of the first internal electrode 13, and a dark pear-skin pattern is provided for the overlap region B between the semiconductor light emitting device LE1 and the electrode portion 15b of the second internal electrode 15. As shown in FIG. 5, the areas of the region A and the region B are equal to each other.

Each of the internal electrode layers 11 has the same configuration as the outermost internal electrode layer 11A and has the first internal electrode 13 and second internal electrode 15.

The internal electrode layer 21 is constructed with a third internal electrode 23 electrically connected through the first through-hole conductors 17 to the first external electrode 42, first connection electrode 7, and first terminal electrode 5, and a fourth internal electrode 25 electrically connected through the second through-hole conductors 27 to the second external electrode 43, second connection electrode 8, and second terminal electrode 6. The third internal electrode 23 and the fourth internal electrode 25 have mutually different polarities and are in no physical and electrical contact with each other. The third internal electrode 23 and fourth internal electrode 25 are formed by dividing an electrode of a rectangular plate shape covering an almost entire area of the top surface of the varistor layer 9B, in such an approximate L-shape that divided electrodes are in a point symmetry with respect to a center point of the varistor layer 9B.

Specifically, the third internal electrode 23 includes an electrode portion 23a of a rectangular shape extending along the one short edge 9a in the longitudinal direction of the varistor layer 9B, and an electrode portion 23b of a rectangular shape extending along the other long edge 9d of the varistor layer 9B. The electrode portion 23a and electrode portion 23b are connected near the corner between the short edge 9a and the long edge 9d of the varistor layer 9B to be integrally formed. The fourth internal electrode 25 includes an electrode portion 25a of a rectangular shape extending along the other short edge 9c in the longitudinal direction of the varistor layer 9B, and an electrode portion 25b of a rectangular shape extending along the one long edge 9b of the varistor layer 9B. The electrode portion 25a and electrode portion 25b are connected near the corner between the short edge 9c and the long edge 9b of the varistor layer 9B to be integrally formed.

The electrode portion 23a of the third internal electrode 23 is formed in the same shape as the first connection electrode 7 and first terminal electrode 5 so as to overlap therewith when viewed from the lamination direction. The electrode portion 25a of the fourth internal electrode 25 is formed in the same shape as the second connection electrode 8 and the second terminal electrode 6 so as to overlap therewith when viewed from the lamination direction. The electrode portion 23b of the third internal electrode 23 extends from the electrode portion 23a toward the electrode portion 25a while having a width nearly equal to half of the width of the varistor layer 9B. The electrode portion 25b of the fourth internal electrode 25 extends from the electrode portion 25a toward the electrode portion 23a while having a width nearly equal to half of the width of the varistor layer 9B. When viewed from the lamination direction, the electrode portion 23b overlaps with the electrode portion 15b and the electrode portion 25b overlaps with the electrode portion 13b. A space of a predetermined width is formed between the electrode portion 23a and the electrode portion 25b, between the electrode portion 23b and the electrode portion 25b, and between the electrode portion 23b and the electrode portion 25a so as to keep them in no contact with each other.

The respective first internal electrodes 13 of the outermost internal electrode layer 11A and the internal electrode layers 1, and the respective third internal electrodes 23 of the internal electrode layers 21 are physicals and electrically connected to each other through the first through-hole conductors 17, as shown in FIG. 3. A pair of first through-hole conductors 17 are arranged in the width direction of the varistor element body 1 and formed so as to penetrate the interior of the varistor element body 1 in the lamination direction. One ends of the first through-hole conductors 17 are physically and electrically connected to the first terminal electrode 5. The other ends of the first through-hole conductors 17 are physically and electrically connected to the first connection electrode 7. This makes the first internal electrodes 13 of the respective internal electrode layers 11 and the third internal electrodes 23 of the respective internal electrode layers 21 electrically connected through the first through-hole conductors 17 to the first terminal electrode 5 and the first connection electrode 7.

The respective second internal electrodes 15 of the outermost internal electrode layer 11A and the internal electrode layers 11, and the respective fourth internal electrodes 25 of the internal electrode layers 21 are physically and electrically connected to each other through the second through-hole conductors 27, as shown in FIG. 3. A pair of second through-hole conductors 27 are arranged in the width direction of the varistor element body 1 and formed so as to penetrate the interior of the varistor element body 1 in the lamination direction. One ends of the second through-hole conductors 27 are physically and electrically connected to the second terminal electrode 6. The other ends of the second through-hole conductors 27 are physically and electrically connected to the second connection electrode 8. This makes the second internal electrodes 15 of the respective internal electrode layers 11 and the fourth internal electrodes 25 of the respective internal electrode layers 21 electrically connected through the second through-hole conductors 27 to the second terminal electrode 6 and the second connection electrode 8.

The first internal electrodes 13 and second internal electrodes 15 of the outermost internal electrode layer 11A and the internal electrode layer 11, and the third internal electrodes 23 and fourth internal electrodes 25 of the internal electrode layers 21 contain an electroconductive material. There are no particular restrictions on the electroconductive material in the first internal electrodes 13, the second internal electrodes 15, the third internal electrodes 23, and the fourth internal electrodes 25, but it is preferably a material consisting of Ag or an Ag—Pd alloy. The thickness of the internal electrode layers 11, 21 is, for example, approximately in the range of 1 to 5 μm. The internal electrode layers 11, 21 are constructed as sintered bodies of an electroconductive paste containing the foregoing electroconductive material.

The first through-hole conductors 17 and the second through-hole conductors 27 contain an electroconductive material. The electroconductive material in the first through-hole conductors 17 and the second through-hole conductors 27 preferably consists of at least one metal selected from the group consisting of Pd, Ag, Cu, W, Mo, Sn, and Ni, or an alloy containing at least one of the metals. The diameter of the through-hole conductors 17, 27 is, for example, approximately in the range of 10 to 500 μm.

The through-hole conductors 17, 27 are made by forming through holes 10 penetrating each of the varistor layers 9A, 9B in the lamination direction, as shown in FIG. 4, by punching or drilling, filling the through holes 10 with an electroconductive paste, and firing it simultaneously with the varistor layers 9A, 9B and the internal electrode layers 11, 21. The through holes 10 are formed, for example, by laminating a plurality of varistor layers 9A, 9B to obtain a laminate, and perforating the laminate by punching or drilling.

As described above, when viewed from the lamination direction, the electrode portion 23b overlaps with the electrode portion 15b and the electrode portion 25b overlaps with the electrode portion 13b. Therefore, a region in the varistor layer 9B where the first internal electrode 13 overlaps with the fourth internal electrode 25 and a region in the varistor layer 9B where the second internal electrode 15 overlaps with the third internal electrode 23 function as regions to exhibit the varistor characteristic. In the multilayer chip varistor V1 having the above-described configuration, the first internal electrodes 13, the fourth internal electrodes 25, and the overlap regions between the first internal electrodes 13 and the fourth internal electrodes 25 in the varistor layers 9B constitute one varistor section, and the second internal electrodes 15, the third internal electrodes 23, and the overlap regions between the second internal electrodes 15 and the third internal electrodes 23 in the varistor layers 9B constitute one varistor section.

Figure 6:
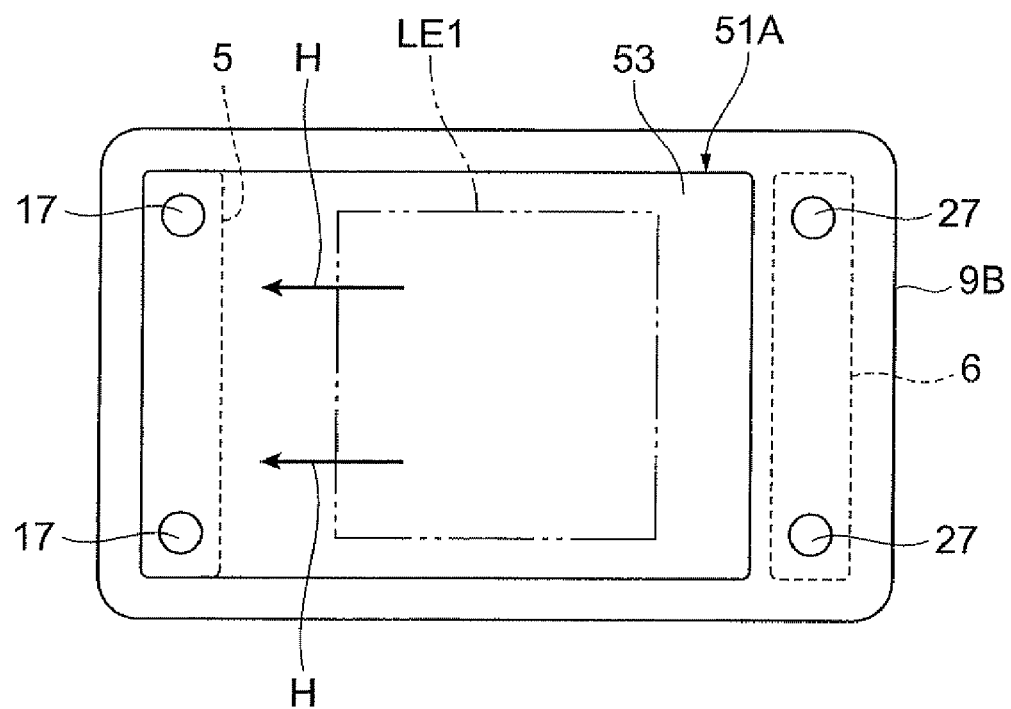
FIG. 6 is a drawing showing a configuration of an outermost internal electrode layer in a conventional electronic component, which is a drawing corresponding to FIG. 5.
Figure 7:
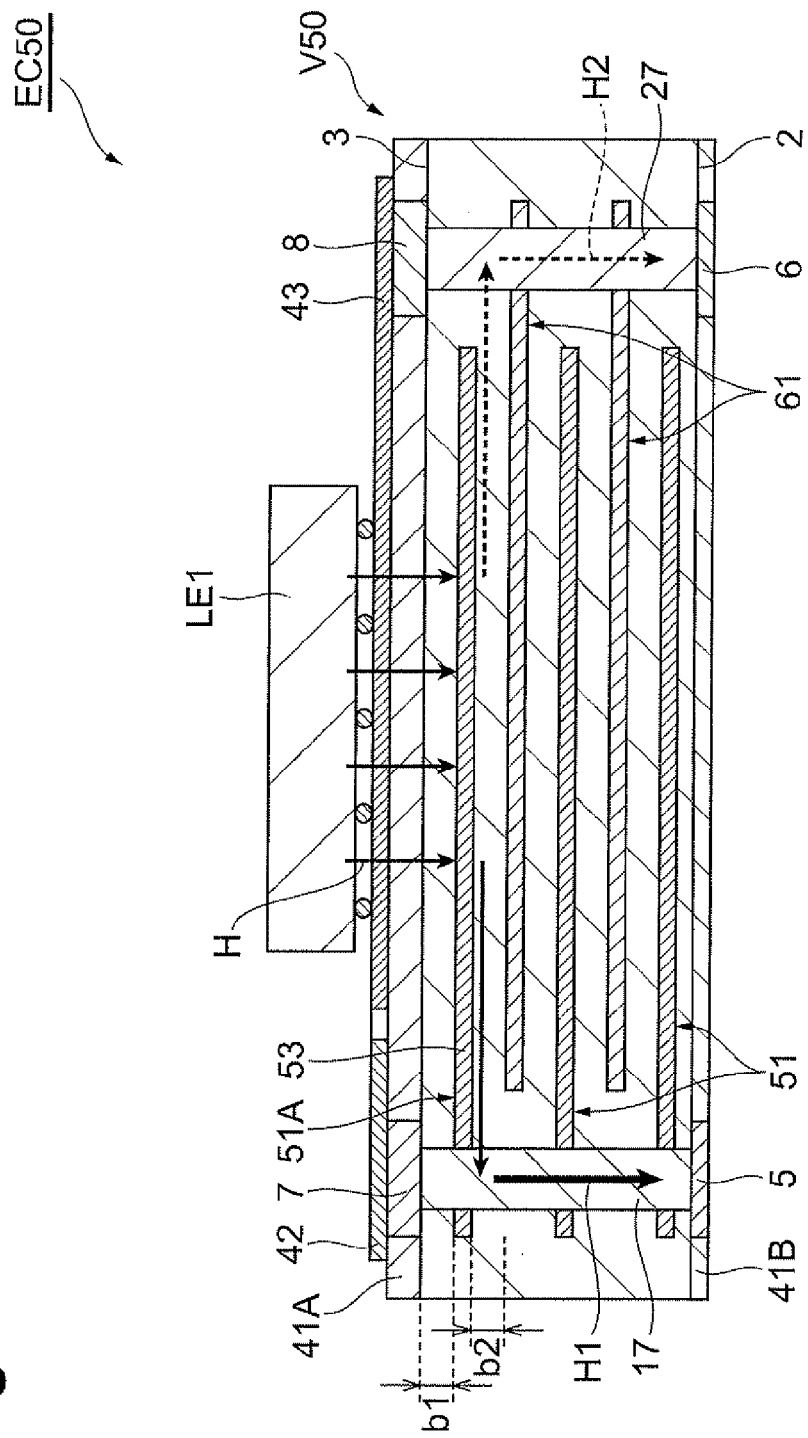
FIG. 7 is a drawing showing a sectional view of the conventional electronic component, which is a drawing corresponding to FIG. 3.

The below will describe the action and effect of the electronic component EC1 and the multilayer chip varistor V1 according to the first embodiment, with reference to FIGS. 3, 5, 6, and 7. FIG. 6 is a drawing showing a configuration of an outermost internal electrode layer in a conventional electronic component, which is a drawing corresponding to FIG. 5. FIG. 7 is a drawing showing a sectional view of the conventional electronic component, which is a drawing corresponding to FIG. 3.

First, the conventional electronic component will be explained for a comparison's sake. The multilayer chip varistor V50 of the conventional electronic component EC50 is mainly different from the multilayer chip varistor V1 of the electronic component EC1 according to the first embodiment in that the thickness between the first principal face 3 and the outermost internal electrode layer 51A is equal to the thickness between the outermost internal electrode layer 51A and the other internal electrode layer 61 opposed to the outermost internal electrode layer 51A on the second principal face 2 side, in that there is no dummy plate provided, and in that the outermost internal electrode layer 51A is composed of only the internal electrode 53 connected to the first external electrode 42, the first connection electrode 7, and the first terminal electrode 5 only.

Specifically, as shown in FIG. 6, the outermost internal electrode layer 51A of the Conventional multilayer chip varistor V50 is composed of only the internal electrode 53 of a rectangular shape covering an almost entire surface except for the region near the other short edge of the varistor layer 9B. This internal electrode 53 is connected to the first through-hole conductors 17 only but is not connected to the second through-hole conductors 27. When viewed from the lamination direction, the semiconductor light emitting device LE1 is arranged so as to be included in the internal electrode 53. In the conventional multilayer chip varistor V50, the varistor layer forming the first principal face 3 has the same thickness as the other varistor layers 9B, whereby the thickness between the first principal face 3 and the outermost internal electrode layer 51A (which is indicated by thickness b1 in FIG. 7) becomes equal to the thickness between the outermost internal electrode layer 51A and the other internal electrode layer 61 opposed to the outermost internal electrode layer 51A on the second principal face 2 side (which is indicated by thickness b2 in FIG. 7), as shown in FIG. 7. Furthermore, there is no dummy plate provided on the first principal face 3.

In the conventional electronic component EC50 and multilayer chip varistor V50 as described above, the thickness between the first principal face 3 and the outermost internal electrode layer 51A (indicated by thickness b1 in FIG. 7) is equal to the thickness between the other internal electrode layer 61 and the outermost internal electrode layer 51A (indicated by thickness b2 in FIG. 7), so as to lengthen the distance from the first principal face 3 to the outermost internal electrode layer 51A. It was, therefore, sometimes the case with the conventional electronic component EC50 and multilayer chip varistor V50 that heat H generated from the bottom surface of the semiconductor light emitting device LE1 was not efficiently transferred to the outermost internal electrode layer 51A. Furthermore, the outermost internal electrode layer 51A is composed of one electrode plate and is connected to the first through-hole conductors 17 only but not connected to the other second through-hole conductors 27; therefore, it was sometimes the case that the heat H from the semiconductor light emitting device LE1 was not adequately transferred to the second through-hole conductors 27 but excessively transferred to the first through-hole conductors 17 (cf. FIG. 6). This worsens a colorific balance between heat H1 transferred to the first through-hole conductors 17 and heat H2 transferred to the second through-hole conductors 27, which sometimes caused a decrease in heat radiation efficiency, so as to result in a failure in achieving good heat radiation performance.

In contrast to it, the multilayer chip varistor V1 of the electronic component EC1 according to the first embodiment is so configured that the thickness between the first principal face 3 and the outermost internal electrode layer 11A is smaller than the thickness between the outermost internal electrode layer 11A and the other internal electrode layer 21 opposed to the outermost internal electrode layer 11A on the second principal face 2 side, as shown in FIG. 3. Therefore, the heat generated from the bottom surface of the semiconductor light emitting device LE1 is sufficiently transferred to the outermost internal electrode layer 11A having the high thermal conductivity.

Furthermore, in the multilayer chip varistor V1 of the electronic component EC1, the outermost internal electrode layer 11A arranged nearest to the first principal face 3 has the first internal electrode 13 electrically connected through the first through-hole conductors 17 to the first connection electrode 7 and the first terminal electrode 5, and the second internal electrode 15 electrically connected through the second through-hole conductors 27 to the second connection electrode 8 and the second terminal electrode 6. Therefore, the heat H generated from the semiconductor light emitting device LE1 is transferred to both the first internal electrode 13 and the second internal electrode 15, thereby to be transferred to the first through-hole conductors 17 and to the second through-hole conductors 27 (cf FIG. 5). This achieves a good colorific balance between heat H1 transferred to the first through-hole conductors 17 and heat H2 transferred to the second through-hole conductors 27, so as to increase the heat radiation efficiency and thus achieve good heat radiation performance.

In the multilayer chip varistor V1 of the first embodiment, the dummy plate 44 having the thermal conductivity higher than that of the varistor element body 1 and not electrically connected to the first connection electrode 7 and the second connection electrode 8 is arranged on the first principal face 3 side with respect to the outermost internal electrode layer 11A, whereby the heat from the semiconductor light emitting device LE1 can diffuse in the dummy plate 44 having the high thermal conductivity, so as to be uniformly transferred to the outermost internal electrode layer 11A.

In the electronic component EC1 of the first embodiment, when viewed from the direction in which the first principal face 3 and the second principal face 2 are opposed, i.e., from the lamination direction, the first internal electrode 13 has the region A overlapping with the semiconductor light emitting device LE1 and the second internal electrode 15 has the region B overlapping with the semiconductor light emitting device LE1. This configuration permits the heat generated from the semiconductor light emitting device LE1 to be securely transferred through the first internal electrode 13 and the second internal electrode 15 to the first through-hole conductors 17 and to the second through-hole conductors 27. Particularly, the areas of the region A and the region B are equal in the first embodiment, whereby the heat is uniformly transferred to the first through-hole conductors 17 and to the second through-hole conductors 27.

Second Embodiment

Figure 8:
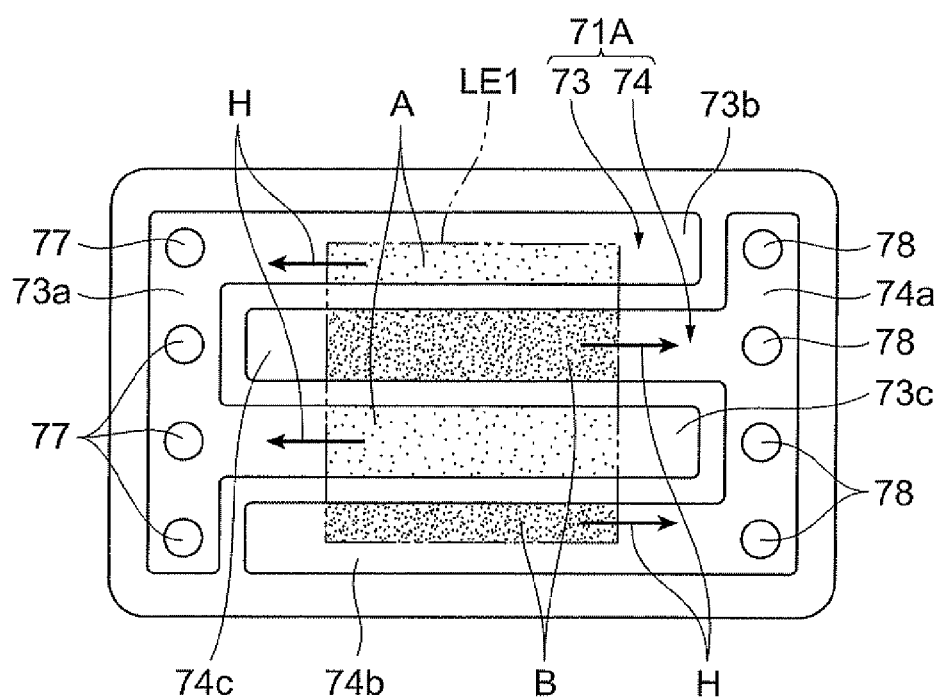
FIG. 8 is a drawing showing a configuration of an outermost internal electrode layer in a multilayer chip varistor according to the second embodiment of the present invention, which is a drawing corresponding to FIG. 5.

FIG. 8 is a drawing showing the configuration of the outermost internal electrode layer 71A in the multilayer chip Varistor V2 according to the second embodiment of the present invention, which is a drawing corresponding to FIG.

Figure 9:
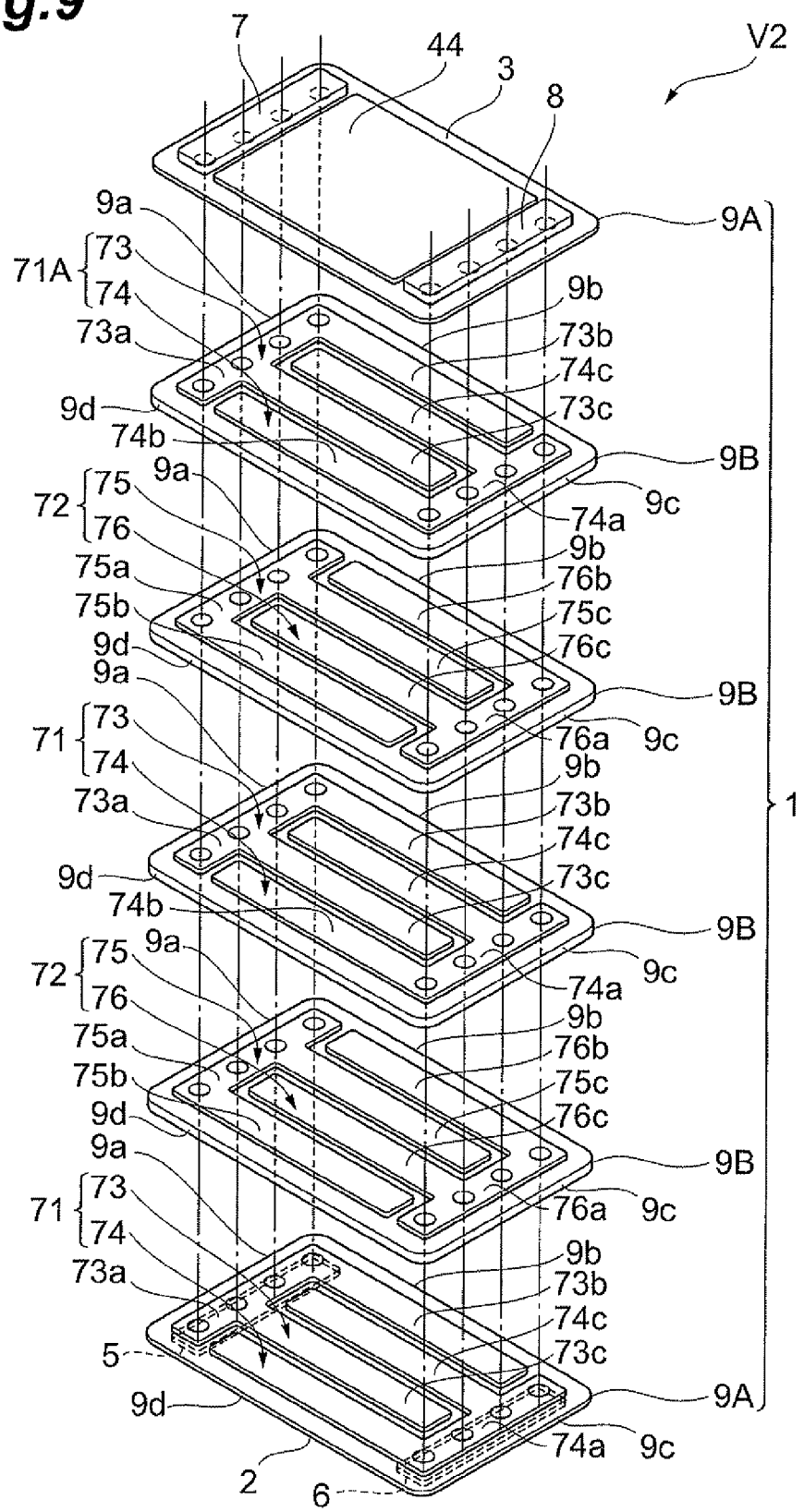
FIG. 9 is a development view in which a varistor element body in the multilayer chip varistor according to the second embodiment of the present invention is developed for illustrating each of varistor layers, which is a drawing corresponding to FIG. 4.

5. FIG. 9 is a development view where the varistor element body 1 in the multilayer chip varistor V2 according to the second embodiment of the present invention is developed for illustrating each of varistor layers, which is a drawing corresponding to FIG. 4. This multilayer chip varistor V2 of the second embodiment is different from the multilayer chip varistor V1 of the first embodiment in that the internal electrodes of the outermost internal electrode layer 71A and the internal electrode layers 71, 72 are formed in a comb shape, instead of the nearly L-shaped internal electrodes 13, 15, 23, 25 of the outermost internal electrode layer 11A and the internal electrode layers 11, 21.

In this multilayer chip varistor V2, the first internal electrode 73 of the outermost internal electrode layer 71A has a pair of first electrode portions 73b, 73c divided in a predetermined direction perpendicular to the direction in which the first principal face 3 and the second principal face 2 are opposed, i.e., perpendicular to the lamination direction. The second internal electrode 74 has a pair of second electrode portions 74b, 74c divided in the predetermined direction. The first electrode portions 73b, 73c and the second electrode portions 74b, 74c are arranged in an alternating manner in the predetermined direction. The predetermined direction in the present embodiment is the width direction of the varistor layer 9B.

Specifically, each of the first internal electrodes 73 of the outermost internal electrode layer 71A and the internal electrode layers 71 includes an electrode portion 73a of a rectangular shape extending along the one short edge 9a in the longitudinal direction of the varistor layer 9B, a first electrode portion 73b of a rectangular shape extending along the one long edge 9b of the varistor layer 9B, and a first electrode portion 73c extending with a space of a fixed distance from the first electrode portion 73b and in parallel therewith, thereby to be formed in the comb shape. The electrode portion 73a and the first electrode portions 73b, 73c are connected on the short edge 9a side of the varistor layer 9B to be integrally formed. The second internal electrode 74 of the outermost internal electrode layer 71A includes an electrode portion 74a of a rectangular shape extending along the other short edge 9c in the longitudinal direction of the varistor layer 9B, a second electrode portion 74b of a rectangular shape extending along the other long edge 9d of the varistor layer 9B, and a second electrode portion 74c extending with a space of a fixed distance from the second electrode portion 74b and in parallel therewith, thereby to be formed in the comb shape. The electrode portion 74a and the second electrode portions 74b, 74c are connected on the short edge 9c side of the varistor layer 9B to be integrally formed.

The electrode portion 73a of the first internal electrode 73 is formed in the same shape as the first connection electrode 7 and the first terminal electrode 5 so as to overlap therewith when viewed from the lamination direction, and the electrode portion 74a of the second internal electrode 74 is formed in the same shape as the second connection electrode 8 and the second terminal electrode 6 so as to overlap therewith when viewed from the lamination direction. The first electrode portions 73b, 73c of the first internal electrode 73 extend from the electrode portion 73a toward the electrode portion 74a with the second electrode portion 74c in between, and the second electrode portions 74b, 74c of the second internal electrode 74 extend from the electrode portion 74a toward the electrode portion 73a with the first electrode portion 73c in between. A space of a predetermined width is formed between the first internal electrode 73 and the second internal electrode 74 so as to keep them in no contact with each other.

The third internal electrode 75 of each internal electrode layer 72 includes an electrode portion 75a of a rectangular shape extending along the one short edge 9a in the longitudinal direction of the varistor layer 9B, a third electrode portion 75b of a rectangular shape extending along the other long edge 9d of the varistor layer 9B, and a third electrode portion 75c extending with a space of a fixed distance from the third electrode portion 75b and in parallel therewith, thereby to be formed in the comb shape. The electrode portion 75a and the third electrode portions 75b, 75c are connected on the short edge 9a side of the varistor layer 9B to be integrally formed. The fourth internal electrode 76 of the internal electrode layer 72 includes an electrode portion 76a of a rectangular shape extending along the other short edge 9c in the longitudinal direction of the varistor layer 9B, a fourth electrode portion 76b of a rectangular shape extending along the one long edge 9b of the varistor layer 9B, and a fourth electrode portion 76c extending with a space of a fixed distance from the fourth electrode portion 76b and in parallel therewith, thereby to be formed in the comb shape. The electrode portion 76a and the fourth electrode portions 76b, 76c are connected on the short edge 9c side of the varistor layer 9B to be integrally formed.

The electrode portion 75a of the third internal electrode 75 is formed in the same shape as the first connection electrode 7 and the first terminal electrode 5 so as to overlap therewith when viewed from the lamination direction, and the electrode portion 76a of the fourth internal electrode 76 is formed in the same shape as the second connection electrode 8 and the second terminal electrode 6 so as to overlap therewith when viewed from the lamination direction. The third electrode portions 75b, 75c of the third internal electrode 75 extend from the electrode portion 75a toward the electrode portion 76a with the fourth electrode portion 76c in between, and the fourth electrode portions 76b, 76c of the fourth internal electrode 76 extend from the electrode portion 76a toward the electrode portion 75a with the third electrode portion 75c in between. A space of a predetermined width is formed between the third internal electrode 75 and the fourth internal electrode 76 so as to keep them in no contact with each other.

There are four first through-hole conductors 77 connected to the first internal electrodes 73 and the third internal electrodes 75, one each at the base position of the first electrode portion 73b and at the base position of the first electrode portion 73c in the electrode portion 73a of the first internal electrode 73 and one each at the base position of the third electrode portion 75b and at the base position of the third electrode portion 75c in the electrode portion 75a of the third internal electrode 75. Furthermore, there are four second through-hole conductors 78 connected to the second internal electrodes 74 and the fourth internal electrodes 76, one each at the base position of the second electrode portion 74b and at the base position of the second electrode portion 74c in the electrode portion 74a of the second internal electrode 74 and one each at the base position of the fourth electrode portion 76b and at the base position of the fourth electrode portion 76c in the electrode portion 76a of the fourth internal electrode 76.

In the first internal electrode 73 and the second internal electrode 74 in the multilayer chip varistor V2 constructed as described above, when viewed from the lamination direction, an area of an overlap region between the semiconductor light emitting device LE1 and the first internal electrode 73 is equal to an area of an overlap region between the semiconductor light emitting device LE1 and the second internal electrode 74. In FIG. 8, the semiconductor light emitting device LE1 is indicated by a chain double-dashed line, a light pear-skin pattern is provided for the overlap region A between the semiconductor light emitting device LE1 and the first electrode portions 73b, 73c of the first internal electrode 73, and a dark pear-skin pattern is provided for the overlap region B between the semiconductor light emitting device LE1 and the second electrode portions 74b, 74c of the second internal electrode 74. As shown in FIG. 8, the areas of the region A and the region B are equal.

In the multilayer chip varistor V2 of the second embodiment as described above, heat H from the semiconductor light emitting device LE1 is transferred through the first electrode portions 73b, 73c to the first through-hole conductors 77 arranged at the base positions thereof, and transferred through the second electrode portions 74b, 74c to the second through-hole conductors 78 arranged at the base positions thereof. As described above, the first internal electrode 73 and the second internal electrode 74 are divided into the electrode portions, whereby each of the electrode portions can be formed so as to be elongated in the direction perpendicular to the direction of division; therefore, the heat can be securely transferred in the desired directions, i.e., in the directions toward the locations of the through-hole conductors.

Third Embodiment

Figure 10:
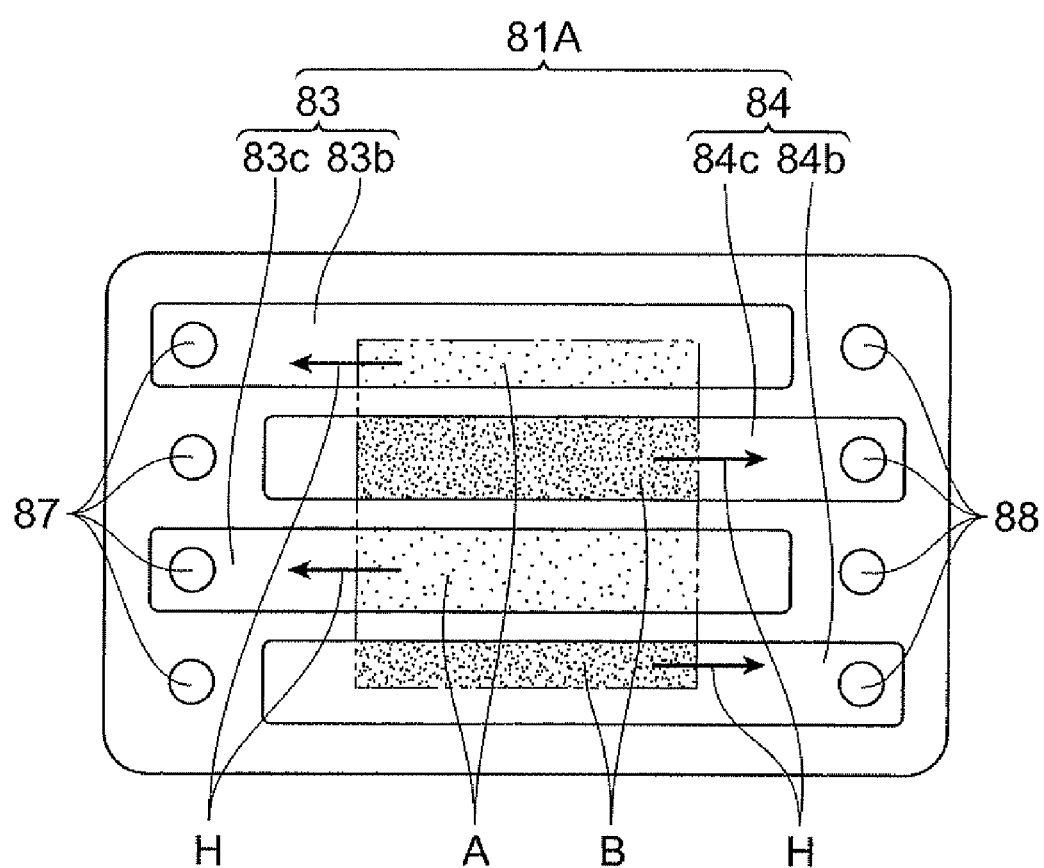
FIG. 10 is a drawing showing a configuration of an outermost internal electrode layer in a multilayer chip varistor according to the third embodiment of the present invention, which is a drawing corresponding to FIG. 5.
Figure 11:
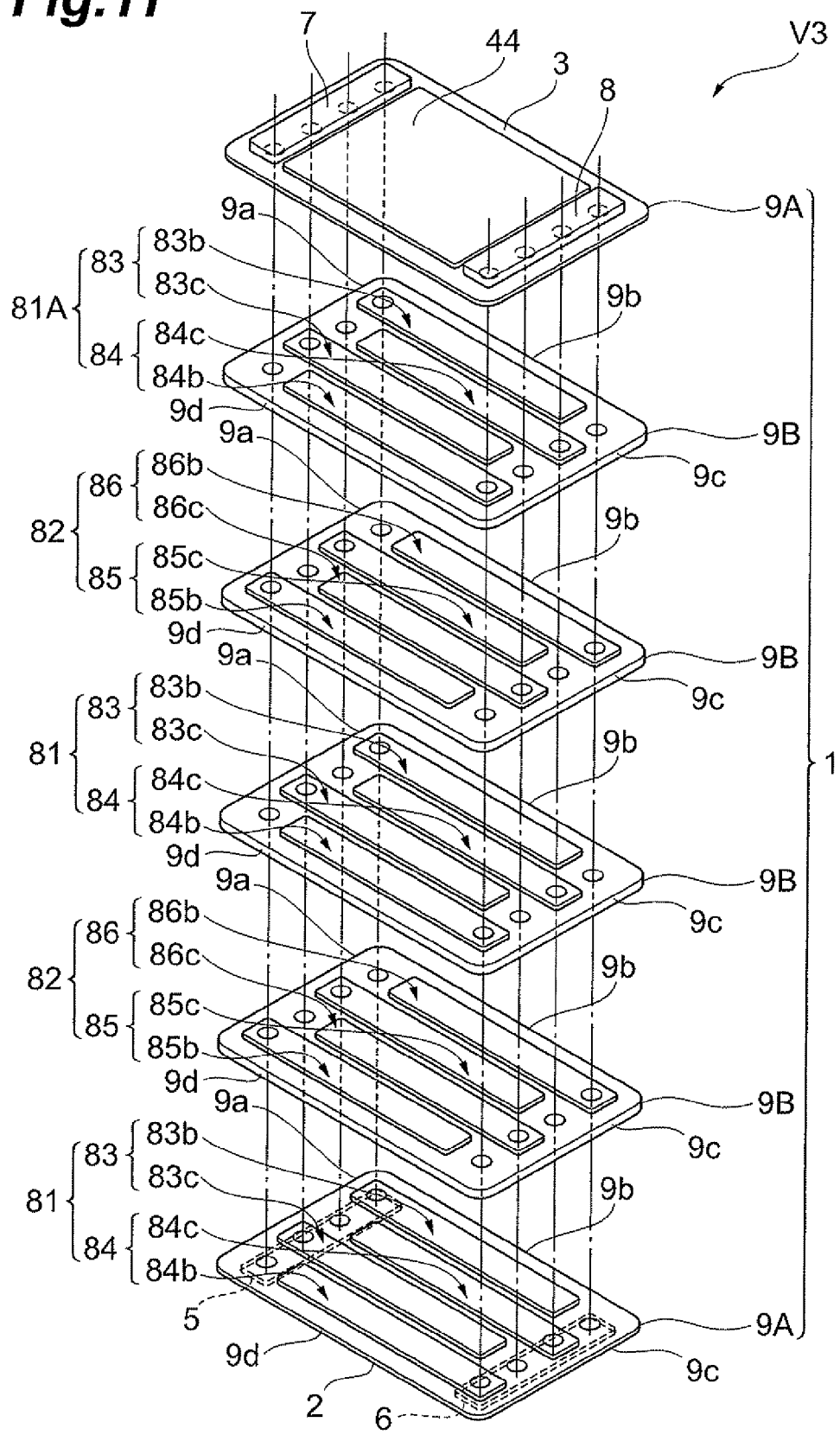
FIG. 11 is a development view in which a varistor element body in the multilayer chip varistor according to the third embodiment of the present invention is developed for illustrating each of varistor layers, which is a drawing corresponding to FIG. 4.

FIG. 10 is a drawing showing the configuration of the outermost internal electrode layer 81A in the multilayer chip varistor V3 according to the third embodiment of the present invention, which is a drawing corresponding to FIG. 5. FIG. 11 is a development view where the varistor element body 1 in the multilayer chip varistor V3 according to the third embodiment of the present invention is developed for illustrating each of varistor layers, which is a drawing corresponding to FIG. 4. This multilayer chip varistor V3 of the third embodiment is different from the multilayer chip varistor V2 of the second embodiment in that the electrode portions 73a, 74a, 75a, 76a are eliminated from the respective internal electrodes 73, 74, 75, 76 of the outermost internal electrode layer 71A and the internal electrode layers 71, 72 and in that the electrode portions each are independently connected to the corresponding through-hole conductors.

In this multilayer chip varistor V3, the first internal electrode 83 of the outermost internal electrode layer 81A has a pair of first electrode portions 83b, 83c independently connected to respective first through-hole conductors 87, and the second internal electrode 84 has a pair of second electrode portions 84b, 84c independently connected to respective second through-hole conductors 88. The first electrode portions 83b, 83c and the second electrode portions 84b, 84c are arranged in an alternating manner in the predetermined direction.

Specifically, each of the first internal electrodes 83 of the outermost internal electrode layer 81A and the internal electrode layers 81 includes a first electrode portion 83b of a rectangular shape extending along the one long edge 9b of the varistor layer 9B, and a first electrode portion 83c extending with a space of a fixed distance from the first electrode portion 83b and in parallel therewith, as separate bodies. The second internal electrode 84 of the outermost internal electrode layer 81A includes a second electrode portion 84b of a rectangular shape extending along the other long edge 9d of the varistor layer 9B, and a second electrode portion 84c extending with a space of a fixed distance from the second electrode portion 84b and in parallel therewith, as separate bodies.

The first electrode portions 83b, 83c of the first internal electrode 83 extend from the short edge 9a toward the short edge 9c with the second electrode portion 84c in between, and the second electrode portions 84b, 84c of the second internal electrode 84 extend from the short edge 9c toward the short edge 9a with the first electrode portion 83c in between. A space of a predetermined width is formed between the electrode portions so as to keep them in no contact with each other.

The third internal electrode 85 of each internal electrode layer 82 includes a third electrode portion 85b of a rectangular shape extending along the other long edge 9d of the varistor layer 9B, and a third electrode portion 85c extending with a space of a fixed distance from the third electrode portion 85b and in parallel therewith, as separate bodies. The fourth internal electrode 86 of each internal electrode layer 82 includes a fourth electrode portion 86b of a rectangular shape extending along the one long edge 9b of the varistor layer 9B, and a fourth electrode portion 86c extending with a space of a fixed distance from the fourth electrode portion 86b and in parallel therewith, as separate bodies.

The third electrode portions 85b, 85c of the third internal electrode 85 extend from the short edge 9a toward the short edge 9c with the fourth electrode portion 86c in between, and the fourth electrode portions 86b, 86c of the fourth internal electrode 86 extend from the short edge 9c toward the short edge 9a with the third electrode portion 85c in between. A space of a predetermined width is formed between the electrode portions so as to keep them in no contact with each other.

There are four first through-hole conductors 87 connected to the first internal electrodes 83 and the third internal electrodes 85, one each at the end of the first electrode portion 83b and at the end of the first electrode portion 83c and one each at the end of the third electrode portion 85b and at the end of the third electrode portion 85c. There are four second through-hole conductors 88 connected to the second internal electrodes 84 and the fourth internal electrodes 86, one each at the end of the second electrode portion 84b and at the end of the second electrode portion 84c and one each at the end of the fourth electrode portion 86b and at the end of the fourth electrode portion 86c.

In the first internal electrode 83 and the second internal electrode 84 in the multilayer chip varistor V3 constructed as described above, when viewed from the lamination direction, an area of an overlap region between the semiconductor light emitting device LE1 and the first internal electrode 83 is equal to an area of an overlap region between the semiconductor light emitting device LE1 and the second internal electrode 84. In FIG. 10, the semiconductor light emitting device LE1 is indicated by a chain double-dashed line, a light pear-skin pattern is provided for the overlap region A between the semiconductor light emitting device LE1 and the first electrode portions 83b, 83c of the first internal electrode 83, and a dark pear-skin pattern is provided for the overlap region B between the semiconductor light emitting device LE1 and the second electrode portions 84b, 84c of the second internal electrode 84. As shown in FIG. 10, the areas of the region A and the region B are equal.

In the multilayer chip varistor V3 of the third embodiment as described above, the heat H from the semiconductor light emitting device LE1 is transferred through the first electrode portions 83b, 83c to the first through-hole conductors 87 arranged at the base positions thereof and transferred through the second electrode portions 84b, 84c to the second through-hole conductors 88 arranged at the base positions. As described above, the first internal electrodes 83 and the second internal electrodes 84 are divided into the electrode portions, whereby each of the electrode portions can be formed so as to be elongated in the direction perpendicular to the direction division; therefore, the heat can be securely transferred in the desired directions, i.e., in the directions toward the locations of the through-hole conductors.

Fourth Embodiment

Figure 12:
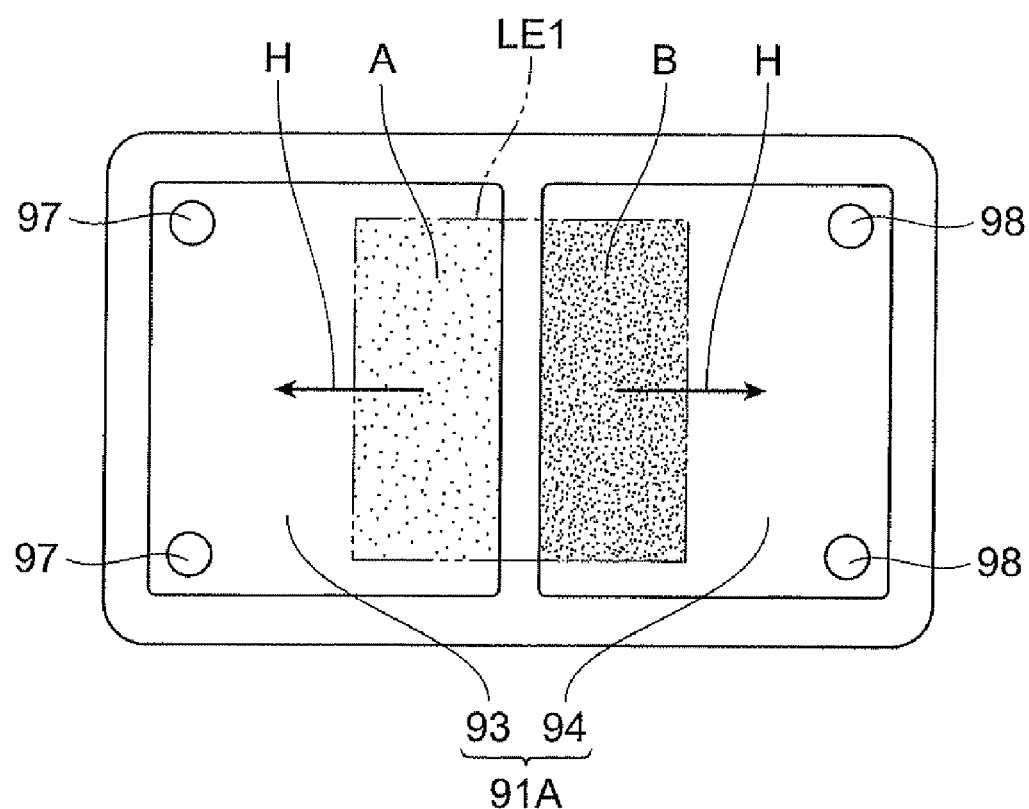
FIG. 12 is a drawing showing a configuration of an outermost internal electrode layer in a multilayer chip varistor according to the fourth embodiment of the present invention, which is a drawing corresponding to FIG. 5.
Figure 13:
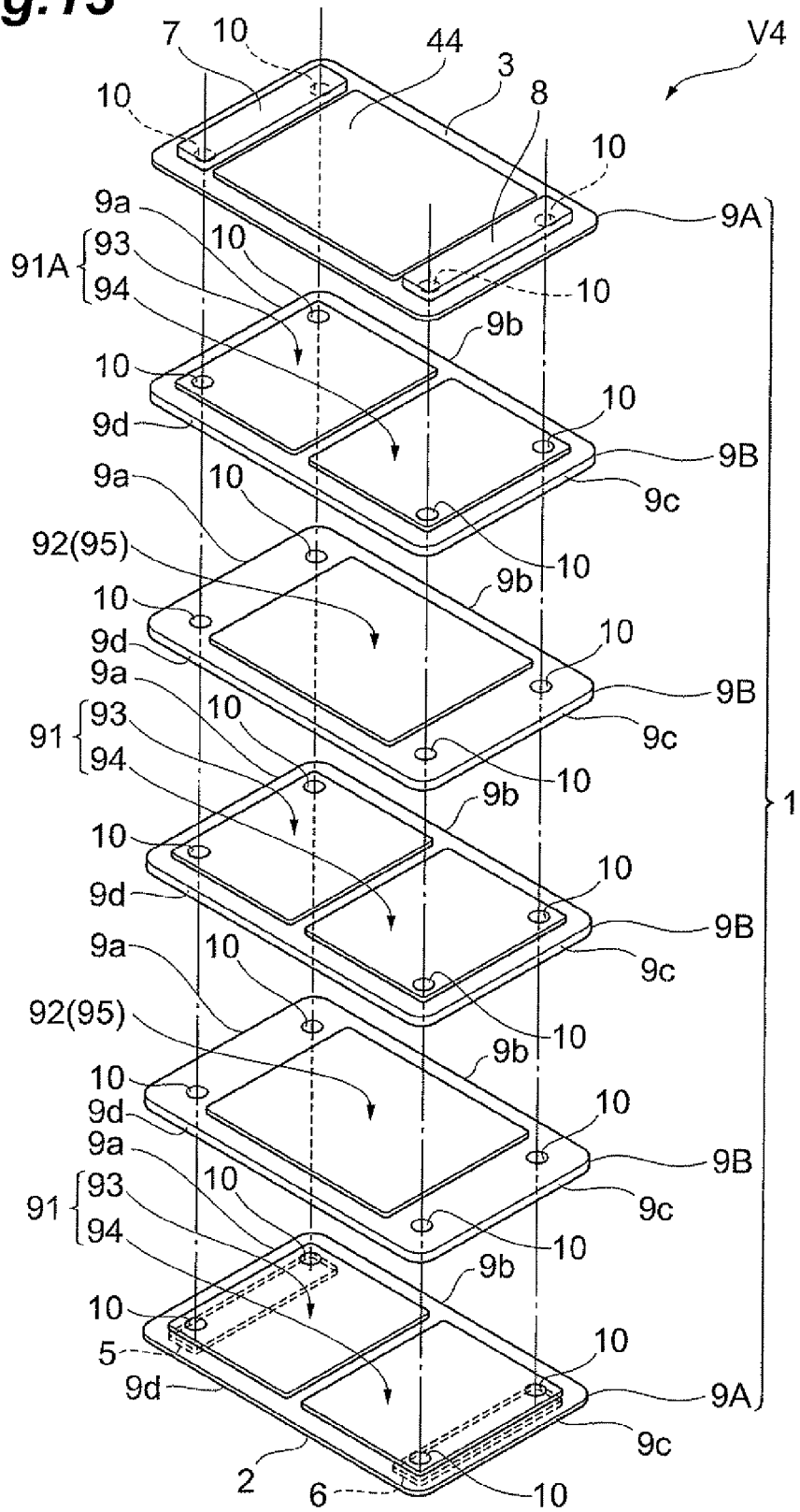
FIG. 13 is a development view in which a varistor element body in the multilayer chip varistor according to the fourth embodiment of the present invention is developed for illustrating each of varistor layers, which is a drawing corresponding to FIG. 4.

FIG. 12 is a drawing showing the configuration of the outermost internal electrode layer 91A in the multilayer chip varistor V4 according to the fourth embodiment of the present invention, which is a drawing corresponding to FIG. 5. FIG. 13 is a development view where the varistor element body 1 in the multilayer chip varistor V4 according to the fourth embodiment of the present invention is developed for illustrating each of varistor layers, which is a drawing corresponding to FIG. 4. This multilayer chip varistor V4 of the fourth embodiment is different from the multilayer chip varistor V1 of the first embodiment in that the internal electrodes of the outermost internal electrode layer 91A and the internal electrode layers 91 are divided in the longitudinal direction of the varistor layer 9B, instead of the nearly L-shaped internal electrodes 13, 15, 23, 25 of the outermost internal electrode layer 11A and the internal electrode layers 11, 21.

Specifically, each of first internal electrodes 93 of the outermost internal electrode layer 91A and the internal electrode layers 91 is arranged in a rectangular shape on the short edge 9a side of the varistor layer 9B and each second internal electrode 94 is arranged in a rectangular shape on the short edge 9c side. The first internal electrode 93 and the second internal electrode 94 are arranged in juxtaposition so that a space is formed in the center in the longitudinal direction of the varistor layer 9B. The first internal electrode 93 is electrically and physically connected to first through-hole conductors 97 and the second internal electrode 94 is electrically and physically connected to second through-hole conductors 98. A third internal electrode 95 of each internal electrode layer 92 is formed in such a rectangular shape as to cover an almost entire surface except for the short edges 9a, 9c, in the center of the varistor layer 9B. The third internal electrode 95 is not connected to the first through-hole conductors 97 and the second through-hole conductors 98.

In the first internal electrode 93 and the second internal electrode 94 configured as described above, when viewed from the lamination direction, an area of an overlap region between the semiconductor light emitting device LE1 and the first internal electrode 93 is equal to an area of an overlap region between the semiconductor light emitting device LE1 and the second internal electrode 94. In FIG. 12, the semiconductor light emitting device LE1 is indicated by a chain double-dashed line, a light pear-skin pattern is provided for the overlap region A between the semiconductor light emitting device LE1 and the first internal electrode 93, and a dark pear-skin pattern is provided for the overlap region B between the semiconductor light emitting device LE1 and the second internal electrode 94. As shown in FIG. 12, the areas of the region A and the region B are equal.

The above described the preferred embodiments of the present invention, but it should be noted that the present invention is by no means limited to the above-described embodiments and that the present invention can be modified in various ways without departing from the spirit and scope of the invention.

For example, the second embodiment showed the configuration wherein the internal electrodes were divided in the width direction of the varistor layer, but there are no particular restrictions on the direction of division as long as it is a direction intersecting with the lamination direction. For example, it is possible to adopt a configuration wherein the internal electrodes are divided in the longitudinal direction of the varistor layer.

The second embodiment and third embodiment showed the configurations wherein the internal electrodes were divided into two portions, but it is also possible to adopt a configuration in which the internal electrodes are divided into three or more portions, instead thereof.

In each of the embodiments, when viewed from the lamination direction, the area of the overlap region of the first internal electrode with the semiconductor light emitting device LE1 is equal to that of the second internal electrode, but they do not always have to be perfectly equal. The effect of the present invention can also be adequately achieved even if the areas are different.

The electronic device does not always have to be limited to the semiconductor light emitting device LE1, but may be a FET (Field Effect Transistor) or the like. There are no particular restrictions on the electronic device as long as it generates heat during operation thereof.

Figure 14:
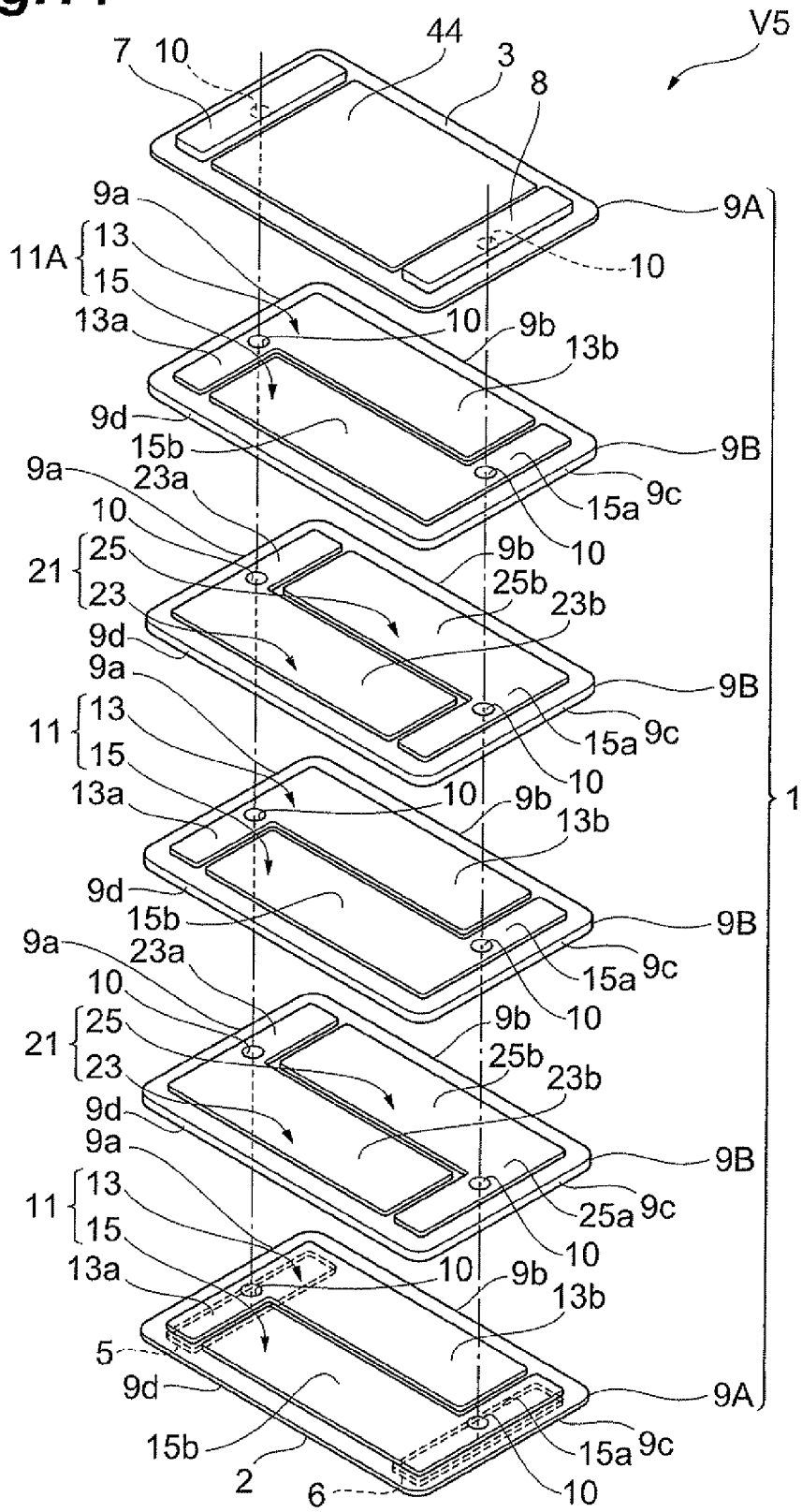
FIG. 14 is a development view of a multilayer chip varistor according to a modification example, which is a drawing corresponding to FIG. 4.

The number of through-hole conductors in each of the embodiments is not limited to that in the foregoing embodiments. For example, the first embodiment showed the configuration wherein a pair of through-hole conductors were provided on both end sides so that the totally four through-hole conductors were formed, but, instead thereof it is also possible to adopt a configuration wherein one through-hole conductor is provided on each of the two end sides so that totally two through-hole conductors are formed, as shown in FIG. 14.

What is claimed is:

1. A multilayer chip varistor comprising:
   a varistor element body exhibiting a nonlinear voltage-current characteristic and having a first principal face and a second principal face opposed to each other;
   a plurality of internal electrode layers arranged with a part of the varistor element body in between, in the varistor element body;
   a first connection electrode arranged on the first principal face and a second connection electrode arranged on the first principal face; and
   a first terminal electrode arranged on the second principal face and electrically connected to the first connection electrode, and a second terminal electrode arranged on the second principal face and electrically connected to the second connection electrode,
   wherein an outermost internal electrode layer arranged nearest to the first principal face among the plurality of internal electrode layers has a first internal electrode electrically connected to the first connection electrode and the first terminal electrode through a first internal conductor, and a second internal electrode electrically connected to the second connection electrode and the second terminal electrode through a second internal conductor, and
   wherein a thickness between the first principal face and the outermost internal electrode layer is smaller than a thickness between the outermost internal electrode layer and the other internal electrode layer opposed to the outermost internal electrode layer on the second principal face side.

2. The multilayer chip varistor according to claim 1, wherein the varistor element body comprises a planar member which has a thermal conductivity higher than that of the varistor element body and which is not electrically connected to the first and second connection electrodes, and wherein the planar member is arranged on the first principal face side with respect to the outermost internal electrode layer.

3. The multilayer chip varistor according to claim 1, wherein the first internal electrode has a plurality of first electrode portions in a predetermined direction intersecting with a direction in which the first principal face and the second principal face are opposed, wherein the second internal electrode has a plurality of second electrode portions in the predetermined direction, and wherein the plurality of first electrode portions and the plurality of second electrode portions are arranged in an alternating manner in the predetermined direction.

4. The multilayer chip varistor according to claim 1, wherein the first and second internal conductors are through-hole conductors penetrating an interior of the varistor element body in a direction in which the first principal face and the second principal face are opposed.

5. An electronic component comprising:
a multilayer chip varistor comprising: a varistor element body exhibiting a nonlinear voltage-current characteristic and having a first principal face and a second principal face opposed to each other; a plurality of internal electrode layers arranged with a part of the varistor element body in between, in the varistor element body; a first connection electrode arranged on the first principal face and a second connection electrode arranged on the first principal face; and a first terminal electrode arranged on the second principal face and electrically connected to the first connection electrode, and a second terminal electrode arranged on the second principal face and electrically connected to the second connection electrode; and an electronic device mounted on the first and second connection electrodes of the multilayer chip varistor, wherein an outermost internal electrode layer arranged nearest to the first principal face among the plurality of internal electrode layers has a first internal electrode electrically connected to the first connection electrode and the first terminal electrode through a first internal conductor, and a second internal electrode electrically connected to the second connection electrode and the second terminal electrode through a second internal conductor, and wherein a thickness between the first principal face and the outermost internal electrode layer is smaller than a thickness between the outermost internal electrode layer and the other internal electrode layer opposed to the outermost internal electrode layer on the second principal face side.

6. The electronic component according to claim 5, wherein the first and second internal electrodes have respective regions overlapping with the electronic device when viewed from a direction in which the first principal face and the second principal face are opposed.

7. The electronic component according to claim 5, wherein the electronic device is a semiconductor light emitting device.

* * * * *